(12) United States Patent
Hugo et al.

(10) Patent No.: US 10,677,856 B2
(45) Date of Patent: Jun. 9, 2020

(54) FACILITATING RELIABLE CIRCUIT BOARD PRESS-FIT CONNECTOR ASSEMBLY FABRICATION

(71) Applicant: INTERNATIONAL BUSINESS MACHINES CORPORATION, Armonk, NY (US)

(72) Inventors: Stephen M. Hugo, Stewartville, MN (US); Tim Bartsch, Stewartville, MN (US); James D. Bielick, Pine Island, MN (US); David J. Braun, St. Charles, MN (US); John R. Dangler, Rochester, MN (US); Theron L. Lewis, Rochester, MN (US); Jennifer Bennett, Rochester, MN (US); Timothy P. Younger, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 112 days.

(21) Appl. No.: 16/104,206

(22) Filed: Aug. 17, 2018

(65) Prior Publication Data
US 2020/0057102 A1 Feb. 20, 2020

(51) Int. Cl.
*G01R 31/28* (2006.01)
*G01R 31/70* (2020.01)
*H01R 12/58* (2011.01)

(52) U.S. Cl.
CPC ......... *G01R 31/70* (2020.01); *G01R 31/2817* (2013.01); *H01R 12/585* (2013.01)

(58) Field of Classification Search
CPC .......... G01R 1/06; G01R 1/073; G01R 31/02; G01R 31/2817; H01R 12/585;
(Continued)

(56) References Cited

U.S. PATENT DOCUMENTS 3,953,663 A 4/1976 Kelhm, Jr.
4,082,866 A 4/1978 Link
(Continued)

FOREIGN PATENT DOCUMENTS

WO WO 2008/033428 A2 3/2008

OTHER PUBLICATIONS

Hart, Dale, "Fatigue Testing of a Component Lead in a Plated Through Hole", Proceedings of the IEEE 1988 National Aerospace and Electronics Conference (May 23-27, 1988) (5 pages).
(Continued)

*Primary Examiner* — Minh T Tang
(74) *Attorney, Agent, or Firm* — Tihon Poltavets, Esq.; Kevin P. Radigan, Esq.; Heslin Rothenberg Farley & Mesiti P.C.

(57) ABSTRACT

Fabrication of a reliable circuit board assembly with press-fit connectors is facilitated by identifying a press-fit-connector-to-circuit board connection of a circuit board assembly for testing, with one or more press-fit connector pins of the connector being press-fit into one or more corresponding plated through-holes of the circuit board at a first surface of the circuit board. An electrically insulative liquid is applied at a second surface of the circuit board to the corresponding plated through-hole(s) with the press-fit pin(s), where the second surface and the first surface are opposite surfaces of the circuit board. Connection of the press-fit pin(s) to the corresponding plated through-hole(s) is tested to identify a connection failure, where the electrically insulative liquid facilitates identifying the connection failure. A fabrication adjustment to the circuit board assembly can be identified and implemented to address the identified connection failure.

20 Claims, 5 Drawing Sheets

(58) Field of Classification Search
CPC .. H01R 12/7064; H01R 12/7076; H05K 3/42; H05K 3/46; H05K 3/0094; H05K 3/284; H05K 3/308; H05K 3/326
See application file for complete search history.

(56) References Cited

U.S. PATENT DOCUMENTS

| | | | |
|---|---|---|---|
| 5,167,518 | A | 12/1992 | Deacon |
| 6,691,912 | B2 | 2/2004 | Carano et al. |
| 9,086,368 | B2 | 7/2015 | Kuczynski et al. |
| 9,722,336 | B2* | 8/2017 | Cooney ............... H01R 43/205 |
| 2006/0103404 | A1 | 5/2006 | Desai et al. |
| 2007/0270001 | A1* | 11/2007 | Matsumura .......... H01R 12/585 |
| | | | 439/82 |
| 2017/0330316 | A1 | 11/2017 | Czaplewski et al. |
| 2017/0331208 | A1 | 11/2017 | Cooney et al. |
| 2018/0036769 | A1 | 2/2018 | Dow et al. |

OTHER PUBLICATIONS

Mel, et al., "The NIST Definition of Cloud Computing," National Institute of Standards and Technology, Information Technology Laboratory, Special Publication 800-145, Sep. 2011, (pp. 1-7).
International Business Machines Corporation (IBM), "z/Architecture Principles of Operation," IBM® Publication No. SA22-7832-10, Eleventh Edition, Mar. 2015, (pp. 1-1732).
International Business Machines Corporation (IBM), "Power ISA™ Version 2.07B," Apr. 9, 2015, (pp. 1-1527).

* cited by examiner

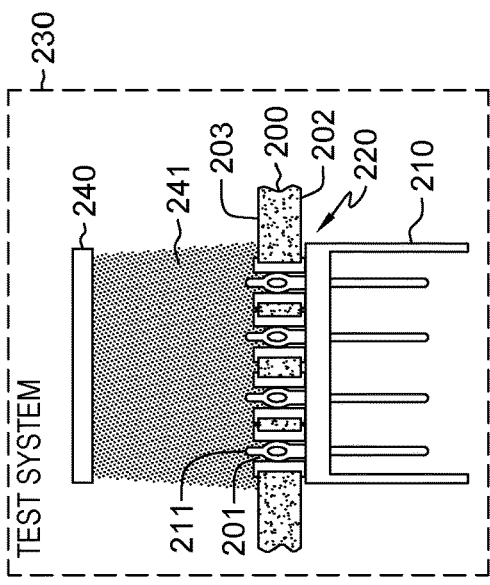
FIG. 2A
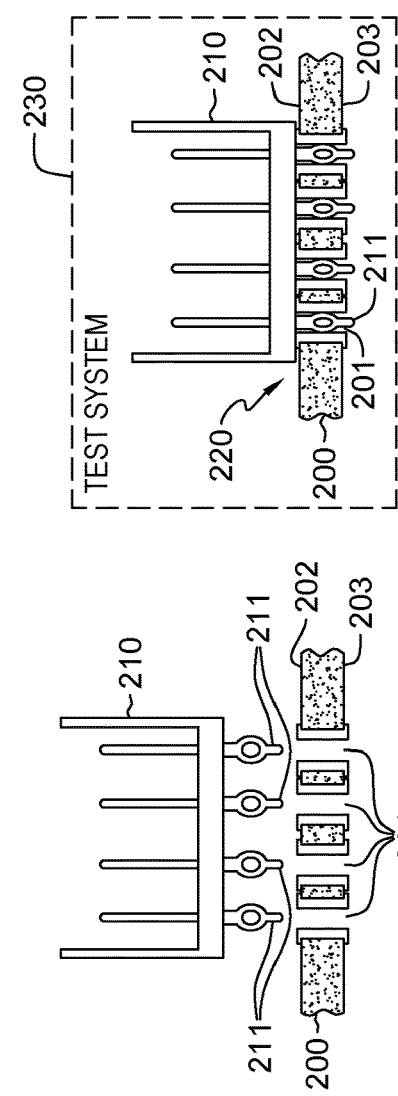
FIG. 2B
FIG. 2C
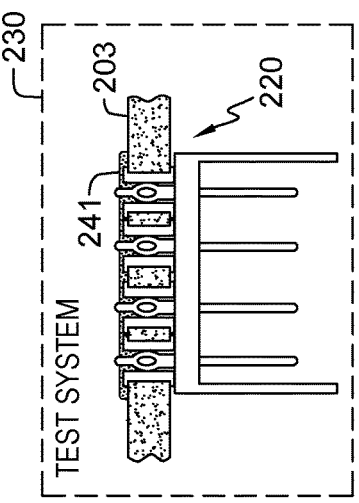
FIG. 2D
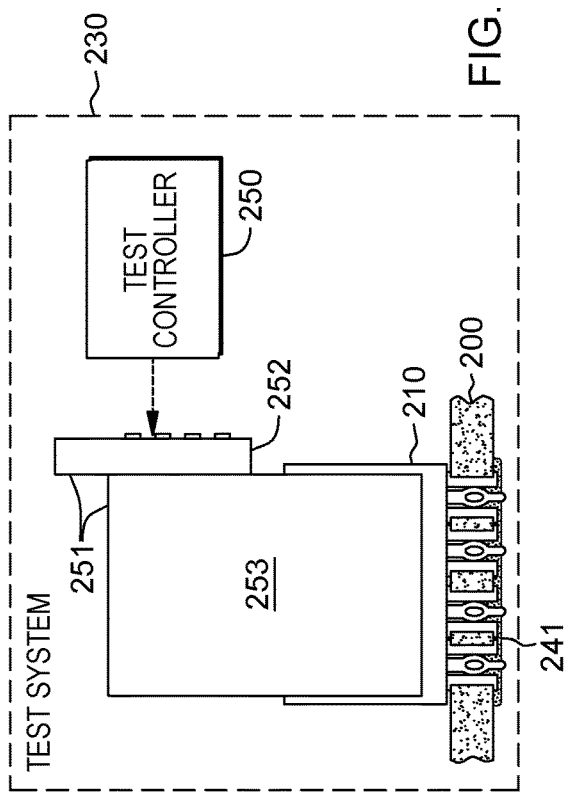
FIG. 2E

FACILITATING RELIABLE CIRCUIT BOARD PRESS-FIT CONNECTOR ASSEMBLY FABRICATION

BACKGROUND

A press-fit, interference fit, or friction fit, is a physical fastening between two parts achieved by friction after the parts are pushed together, rather than by applying a fastener or adhesive. Press-fit connectors are used in the electronics industry by circuit board manufacturers, where press-fit connections allow a manufacturer to avoid, for instance, soldering a connector to a circuit board. In this context, a press-fit connection is typically formed when a pin is pressed into, or fitted into, a plated through-hole in the circuit board. The use of press-fit connectors in circuit board assemblies is pervasive today in the electronics industry.

Press-fit connectors can include solid pins or compliant pins. Today, most press-fit connectors use compliant pin technology, since the pins require less force during the insertion process, which causes less damage to the circuit board plated through-holes, and produces more reliable connections. Press-fit connectors are used in a variety of applications including, for instance, in data and communication applications. For many applications, the press-fit pins are continually becoming smaller. Due to ever-smaller features, the retention force and seal of the press-fit pin to the plated through-hole is becoming more susceptible to failure.

SUMMARY

Certain shortcomings of the prior art are overcome and additional advantages are provided through, in one or more aspects, the provision of a method for facilitating circuit board assembly fabrication. The method includes identifying a press-fit-connector-to-circuit board connection of a circuit board assembly for testing. The press-fit connector includes one or more press-fit pins, and the circuit board includes multiple plated through-holes. The one or more press-fit pins are press-fit into one or more corresponding plated through-holes of the multiple plated through-holes at a first surface of the circuit board. In addition, the method includes applying, at a second surface of the circuit board, an electrically insulative liquid to the one or more corresponding plated through-holes with the one or more press-fit pins, where the first surface and the second surface of the circuit board are opposite surfaces of the circuit board. The one or more press-fit pins within the one or more corresponding plated through-holes are tested to identify a connection failure, where the electrically insulative liquid applied to the one or more corresponding plated through-holes at the second surface of the circuit board facilitates detection of the connection failure, and the identified connection failure can be corrected through an adjustment to the circuit board assembly fabrication.

In another aspect, a system is provided for facilitating circuit board assembly fabrication. The system includes a test controller configured to perform a method of facilitating circuit board assembly fabrication. The test controller identifies a press-fit-connector-to-circuit board connection of the circuit board assembly for testing, where the press-fit-connector includes one or more press-fit pins, and the circuit board includes multiple plated through-holes, the one or more press-fit pins being press-fit into one or more corresponding plated through-holes of the multiple plated through-holes at a first surface of the circuit board, and applies, at a second surface of the circuit board, an electrically insulative liquid to the one or more corresponding plated through-holes with the one or more press-fit pins, where the first surface and the second surface of the circuit board are opposite surfaces of the circuit board. Further, the test controller tests connection of the one or more press-fit pins to the one or more corresponding plated through-holes to identify a connection failure, where the electrically insulative liquid facilitates identifying the connection failure, and the identified connection failure can be corrected through an adjustment to the circuit board assembly fabrication.

In a further aspect, a computer program product for facilitating circuit board assembly fabrication is provided. The computer program product includes a computer readable storage medium having program instructions embodied therewith. The program instructions are executable by a processor to cause the processor to identify a press-fit-connector-to-circuit board connection of the circuit board assembly for testing. The press-fit connector includes one or more press-fit pins, and the circuit board includes multiple plated through-holes. The one or more press-fit pins are press-fit into one or more corresponding plated through-holes of the multiple plated through-holes at a first surface of the circuit board. The program instructions are executable by the processor to further cause the processor to apply, at a second surface of the circuit board, an electrically insulative liquid to the one or more corresponding plated through-holes with the one or more press-fit pins, where the first surface and the second surface of the circuit board are opposite surfaces of the circuit board, and to test connection of the one or more press-fit pins to the one or more corresponding plated through-holes to identify a connection failure. The electrically insulative liquid facilitates identifying the connection failure, and the identified connection failure can be corrected through an adjustment to the circuit board assembly fabrication.

Additional features and advantages are realized through the techniques of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIGS. 2A-2E depict various aspects of one embodiment of a process for facilitating circuit board assembly fabrication, in accordance with one or more aspects of the present invention;

DETAILED DESCRIPTION

Figure 1:
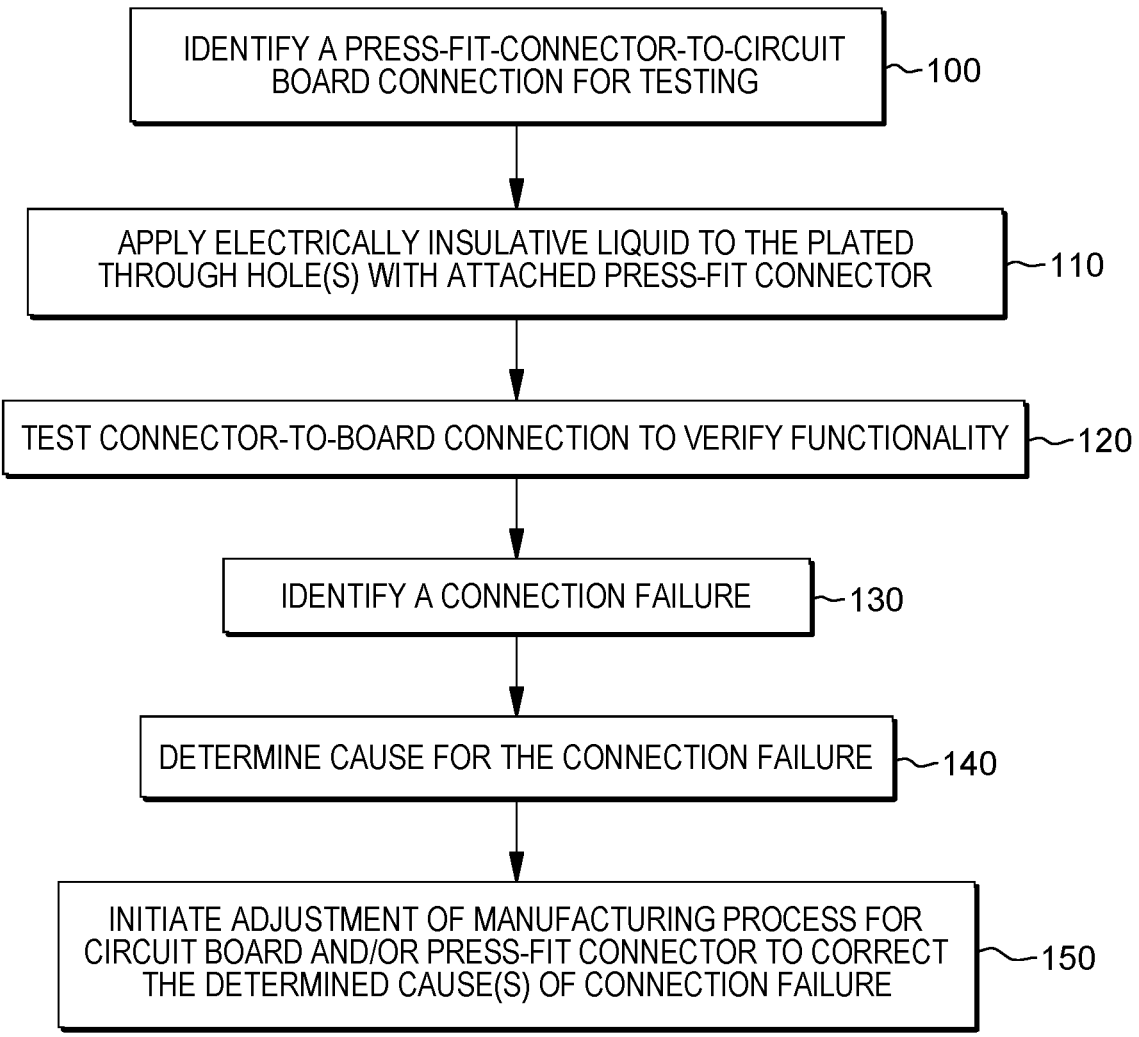
FIG. 1 depicts one embodiment of a process for facilitating circuit board assembly fabrication using press-fit connectors, in accordance with one or more aspects of the present invention.

Aspects of the present invention and certain features, advantages and details thereof, are explained more fully below with reference to the non-limiting example(s) illustrated in the accompanying drawings. Descriptions of well-known systems, devices, processing techniques, etc., are omitted so as to not unnecessarily obscure the invention in detail. It should be understood, however, that the detailed description and this specific example(s), while indicating aspects of the invention, are given by way of illustration only, and not by way of limitation. Various substitutions, modifications, additions, and/or other arrangements, within the spirit and/or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application to facilitate, for instance, providing a method, system and/or computer program product to facilitate circuit board assembly fabrication by, for instance, identifying a connection failure at a press-fit-connector-to-circuit board connection, and determine therefrom a change to the circuit board assembly fabrication process to correct the connection failure.

The illustrative embodiments may be described below using specific code, designs, architectures, protocols, layouts, schematics, or tools only as examples, and are not limited to the illustrative embodiments. Furthermore, the illustrative embodiments may be described in certain instances using particular software, tools, and data processing environments only as example for clarity of description. The illustrative embodiments may be used in conjunction with other comparable or similarly purposed structures, systems, applications, or architectures. An illustrative evaluation control embodiment may be implemented in hardware, software, or a combination thereof.

The examples in this disclosure are used only for clarity of description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed herein.

As computing systems, such as server systems, continue to progress, more press-fit connectors are being used, and the press-fit pins of the connectors continue to become smaller and smaller. Due to their small feature size, the retention force and gas-tight seal for electrical connection between a press-fit pin and a plated through-hole of a circuit board is becoming more susceptible to failure. Disclosed herein, in various aspects, are techniques for evaluating a low-force, press-fit-connector-to-board system to determine whether the connector system can maintain retention and/or electrical contact functionality and reliability over time by using an electrically insulative liquid as part of the testing process. In typical testing approaches, pin measurements are averaged through a common pressing or testing of the connector system, while the method, system and computer program product disclosed herein advantageously allow identification of individual press-fit-pin-to-plated-through-hole connections with defective or marginal contact force, making the connection(s) susceptible to failure over time.

Disclosed herein is a novel approach to facilitating circuit board assembly test and fabrication. In particular, disclosed are novel methods, systems and computer program products which facilitate circuit board assembly fabrication by testing the retention and/or electrical connection of a press-fit connector system of the circuit board assembly, where the circuit board assembly has one or more press-fit connector systems including a press-fit connector press-fit or interference-fit to respective plated through-holes of the circuit board for electrical and mechanical connection of the connector to the circuit board. The processing disclosed can be particularly advantageous during qualification testing of a circuit board assembly, or failure analysis of a circuit board assembly, having one or more press-fit connector systems. The processes disclosed advantageously allow for early detection of a circuit board assembly fabrication defect or error, and thus, correction of the defect to facilitate fabricating of the circuit board.

In general, the methods, systems and computer program products disclosed facilitate circuit board assembly fabrication by identifying a press-fit-connector-to-circuit board connection of the circuit board assembly for testing. The press-fit connector includes one or more press-fit pins, and the circuit board includes multiple plated through-holes. The one or more press-fit pins are press-fit into one or more corresponding plated through-holes of the multiple plated through-holes at a first surface of the circuit board. An electrically insulative liquid is applied at a second surface of the circuit board to the one or more corresponding plated through-holes with the press-fit pins. The first surface and the second surface of the circuit board are opposite surfaces of the circuit board. Connection of the one or more press-fit pins to the one or more corresponding plated through-holes is tested to identify a connection failure, with the electrically insulative liquid facilitating identifying the connection failure. The identified connection failure is correctable through a fabrication change to the circuit board assembly. In one or more implementations, the process includes determining a fabrication change to the circuit board assembly to correct the connection failure, and implementing the change.

In one or more embodiments, the process may further include waiting an interval of time after applying the electrically insulative liquid to allow the electrically insulative liquid to penetrate the one or more corresponding plated through-holes via, at least in part, capillary action. Further, in one or more embodiments, the process includes orienting the circuit board assembly to allow gravity to assist in penetration of electrically insulative liquid into the one or more corresponding plated through-holes with the one or more press-fit pins.

In one embodiment, the testing includes testing a press-fit seal between a press-fit pin of the one or more press-fit pins and a corresponding plated through-hole of the one or more corresponding plated through-holes of the circuit board. The testing can include applying an electrical signal to the press-fit pin to electrically evaluate the connection in the presence of the electrically insulative liquid applied at the second surface of the circuit board. Further, or alternatively, the testing can include retention testing the press-fit pin within the corresponding plated through-hole to mechanically evaluate the connection in the presence of the electrically insulative liquid applied at the second surface of the circuit board.

In one or more implementations, the testing includes continually monitoring electrical connection of the one or more press-fit pins to the one or more corresponding plated through-holes during a reliability stressing of the circuit board assembly. The reliability stressing can include one or more of a retention test, a mechanical shock test, a mechanical vibration test, a G-force test, a vacuum test or assist, and/or a temperature test.

In one or more embodiments, the applying of the electrically insulative liquid includes applying the electrically insulative liquid to, at least in part, the second surface of the circuit board, including over the one or more plated through-holes. Further, in one or more embodiments, applying of the electrically insulative liquid includes using an aerosol application of the electrically insulative liquid, using a spray application of the electrically insulative liquid, using a brush application of the electrically insulative liquid, using a droplet application of the electrically insulative liquid, and/or using a sponge application of the electrically insulative liquid. In one or more embodiments, the electrically insulative liquid is an oil or a refrigerant selected to penetrate the one or more corresponding plated through-holes via at least, capillary action. In one or more embodiments, the electrically insulative liquid is a silicone oil, or in one or more other embodiments, is an insulating fluorocarbon-based fluid, such as Fluorinert™ FC-70 electronic liquid (offered by 3M Company of St. Paul, Minn. (USA)).

By way of example, FIG. 1 depicts one embodiment of a process for facilitating circuit board assembly fabrication using press-fit connectors, in accordance with one or more aspects of the present invention. As shown, the process begins with identifying a press-fit connector-to-circuit board connection for testing 100. As noted above, the process assumes that the circuit board assembly includes one or more press-fit connector systems, or press-fit-connector-to-circuit board connections. Each press-fit-connector-to-circuit board connection may include one or more physical connections one or more press-fit pins to one or more corresponding plated through-holes of the circuit board. By way of example, the selected press-fit-connector-to-circuit board connection may be resident on a main surface of the circuit board assembly, and the press-fit pins of the press-fit connector could couple to plated through-holes of the circuit board around the periphery of the circuit board, or in the main body of the circuit board, or even on the opposite surface of the circuit board from a main component surface, or all three. For instance, there can be multiple press-fit-connector-to-circuit board connections on a particular circuit board assembly being fabricated, and the identifying includes identifying a particular press-fit-connector-to-circuit board connection for testing.

An electrically insulative liquid is applied to the plated through-hole(s) with the attached press-fit connector 110. In one or more embodiments, this includes applying the electrically insulative liquid to the second surface of the circuit board, opposite from the first surface to which the press-fit-connector-to-circuit board connection is made. The electrically insulative liquid is applied to test whether the liquid will penetrate the press-fit seal between the respective press-fit pin(s) and the corresponding plated through-hole (s). Advantageously, this process can be used in a variety of settings to facilitate circuit board assembly fabrication. For instance, the approach can be used during qualification testing to ensure workmanship criteria and reliability is met, and/or during failure analysis to determine why a circuit board assembly has failed.

In one or more embodiments, the electrically insulative liquid is in oil, such as silicone oil. Silicone oil readily wicks or penetrates via capillary action, the plated through-holes, and comes in contact with the press-fit pin within the plated through-hole, as well as the plated through-hole surfaces. The capillary action of the silicone oil in the plated through-hole is high, and the oil collects contaminants that can cause cross-linking of the silicone monomer. The cross-linking makes the oil more insulating. For a failure of a circuit board assembly to occur, a situation may require an event to dislodge or slightly disturb the original press-fit seal or interface between the press-fit pin and the plated through-hole, allowing the resistant material to degrade the resulting contact surface between the two structures. Other electrically insulative liquids can also be used, such as an electrically insulating fluorocarbon-based fluid, such as the above-noted Fluorinert™ FC-70.

The electrically insulative liquid can be applied using multiple techniques, including, for instance, aerosol, spraying, brushing, droplet application, sponge application, etc. Further, the electrically insulative liquid can be applied before and/or after reliability or fragility stress cycles, and allows for continuous monitoring of the electrical connection during application of the electrically insulative liquid. Fragility testing can include mechanical plugging, shock and vibration stressing. Depending on the orientation of the circuit board assembly, the circuit board assembly can be inverted to leverage gravitational forces to facilitate penetration of the electrically insulative liquid into the corresponding plated through-holes. The approach can be used in combination with more aggressive testing to, for instance, pull a vacuum on the circuit board assembly, or applying of a heat gradient or temperature cycling across the circuit board assembly through various thermal methods. Such approaches will also facilitate increasing in the capillary action or forces to facilitate penetration of the electrically insulative liquid into the corresponding plated through-holes with the press-fit pins.

After applying the electrically insulative liquid, the connector-to-board connection can be tested to verify functionality 120. The testing can include electrical testing of the press-fit pins to corresponding plated through-hole connections, as well as retention testing of the press-fit connector system to the circuit board. For instance, the electrically insulative liquid can be used to determine whether there is a liquid or gas-tight seal between the press-fit connector and the plated through-hole (such as a copper plated through-hole). If there is not a gas-tight seal, then oxidation can occur over time resulting in loss of electrical connection. Thus, the processing disclosed provides an approach for early detection of such issues, and therefore, facilitates the circuit board assembly fabrication. Assuming a press-fit seal between a press-fit pin and the corresponding plated through-hole is other than a gas tight seal, then the electrically insulative liquid will penetrate between the two structures, resulting in creating an opening between the two structures, and allowing for identification of a connection failure 130. As noted, a vacuum or thermal gradient process can be utilized for a more aggressive approach to facilitate liquid penetration into the plated through-holes to press-fit pin interfaces.

After identifying a connection failure, the process can include determining a cause for the connection failure 140. For instance, the dimensions of the respective press-fit pin and corresponding plated through-hole can be ascertained and evaluated to determine whether the dimensions are within specification. If so, it may be necessary to re-specify one or both structures for the fabrication process. In another implementation, once a connection failure is identified, processing can determine where the electrical loss occurred, that is, which particular pin has the connection problem. Follow-up cross-section testing can be used to determine which dimensions, if any, are out of specification. Once the cause for the connection failure is determined, then an adjustment can be initiated for the manufacturing process of the circuit board and/or the press-fit connector to correct the determined cause(s) of the connection failure 150. In one or more embodiments, this can include initiating a fabrication change to the circuit board assembly to, for instance, change a dimension of the press-fit pin and/or the plated through-hole to correct the failure condition. Advantageously the processing disclosed herein determines a particular press-fit pin to plate a through-hole via connection at issue, and allows for detection of a problem much more quickly than otherwise possible using other techniques. By being able to detect potentially deficient connections early, the circuit board assembly fabrication process can be adjusted to ensure performance and reliability of the resultant circuit board assembly.

FIGS. 2A-2E depict a more detailed embodiment of a process of facilitating circuit board assembly fabrication, in accordance with one or more aspects of the present invention. As illustrated in FIG. 2A, the process can begin by connecting a press-fit connector 210 with one or more press-fit pins 211 to a circuit board 200, with one or more plated through-holes. In particular, press-fit pins 211 are press-fit or interference-fit into corresponding plated through-holes 201 of circuit board 200 at a first surface 202, where first surface 202 and a second surface 203 are opposite main surfaces of circuit board 200. The resultant circuit board assembly 220 is illustrated in FIG. 2B within a test system 230, which can be configured or utilized based upon the processes disclosed herein. For instance, test system 230 can include one or more test chambers, as well as one or more robotic manipulators, and a test control or engine to perform the various processes disclosed herein.

In FIG. 2C, circuit board assembly 220 is shown inverted with an electrically insulative liquid 241 being applied to second surface 203 of circuit board 200 opposite to first surface 202 to which the press-fit connector 210 is attached. More particularly, electrically insulative liquid 241 is applied at second surface 203 of circuit board 200 to the corresponding plated through-holes 201 of circuit board 200. In one or more embodiments, electrically insulative liquid 241 could be applied as an aerosol from an applicator 240 associated with test system 230.

As shown in FIG. 2D, circuit board assembly 220 can remain in an inverted orientation within test system 230 for an interval of time after applying of the electrically insulative liquid to facilitate penetration of the liquid into the one or more corresponding plated through-holes via, for instance, capillary action, as well by gravity. Further, if desired, a vacuum could be applied to the assembly within the test system to facilitate drawing the electrically insulative liquid into the corresponding plated through-holes in order that the liquid comes into contact with the press-fit seals between the press-fit pins and the corresponding plated through-holes.

FIG. 2E further depicts test system 230 with a test controller 250 controlling electrical testing and/or retention testing of the press-fit connector 210 to circuit board 200 connection in the presence of the electrically insulative liquid 241 within the corresponding plated through-holes. Test controller 250 can test the press-fit-connector-to-circuit board connection via a test probe 251 which can include, for instance, a daughter board 252, and a corresponding press-fit connector piece 253 which couples to the ends of press-fit pins 211 (FIGS. 2A-2C) opposite from the ends within circuit board 200. Any appropriate functional testing of the press-fit connector 210 and/or circuit board 200 can be used to stress and evaluate the press-fit connector-to-circuit board connection, and more particularly, to evaluate each individual press-fit pin to plated through-hole connection.

Those skilled in the art will note that the various aspects disclosed herein improve the technical field of circuit board assembly fabrication by facilitating testing, detection and correction of connection failures associated with a press-fit-connector-to-circuit board connection system, such as a low-force connector system. Further, the one or more aspects disclosed herein are inextricably tied to computer technology in that the circuit board assemblies are part of the computing or electronic system environment itself, and the aspects relate to ensuring reliability and/or improving performance of the electrical and mechanical connection of a press-fit connector to the circuit board in a circuit board assembly for the computer or electronic system.

Exemplary embodiments of computing environments which may implement one or more aspects of the present invention are described below with reference to FIGS. 3-5.

Figure 3:
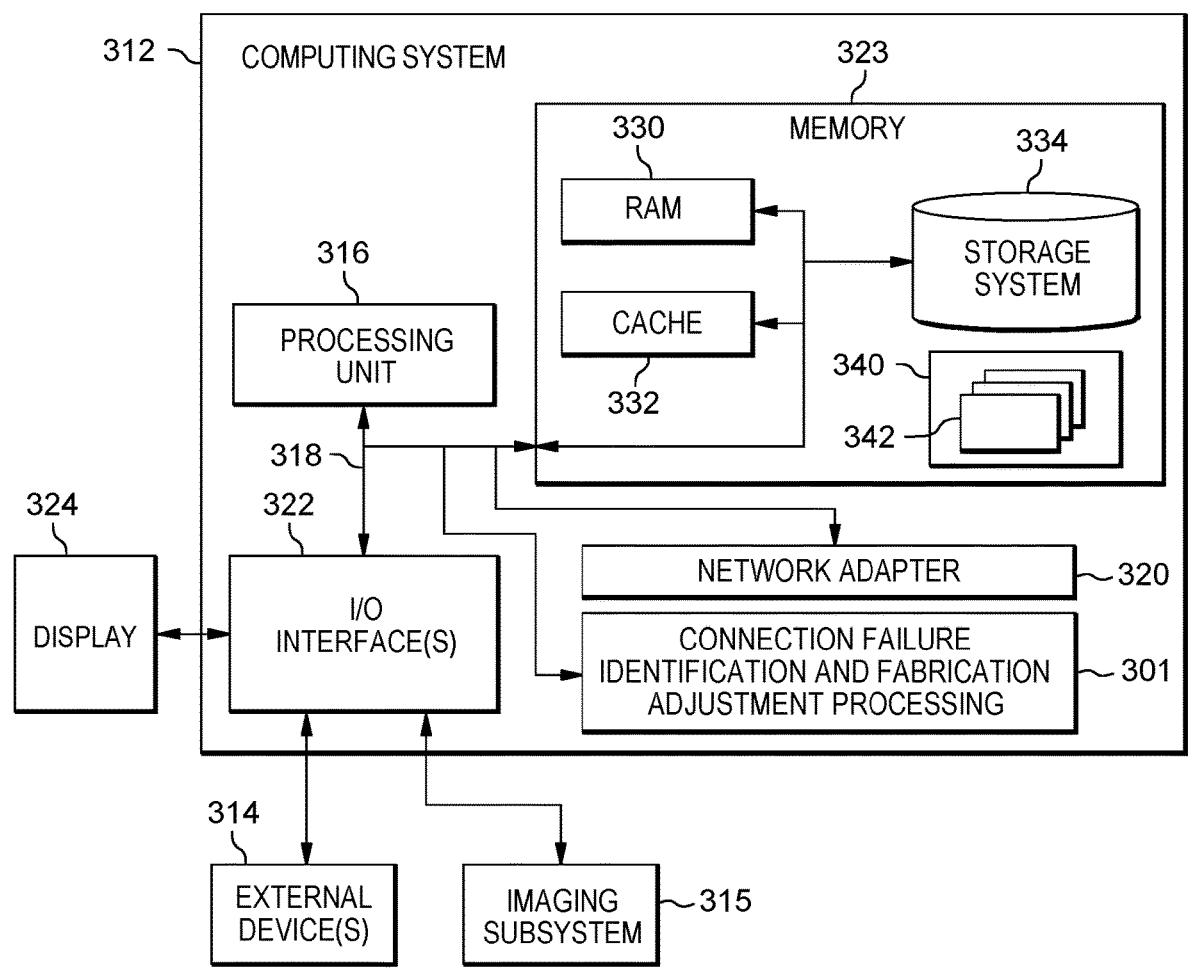
FIG. 3 depicts one embodiment of a computing system which may implement or facilitate implementing one or more aspects of facilitating circuit board assembly fabrication, in accordance with one or more aspects of the present invention.

By way of example, FIG. 3 depicts one embodiment of a computing environment 300, which includes a computing system 312. Examples of well-known computing systems, environments, and/or configurations that may be suitable for use with computer system 312 include, but are not limited to, a server, a desktop computer, a work station, a mobile device, such as a wireless computer, a handheld or laptop computer or device, a mobile phone, a programmable consumer electronic device, a tablet, a personal digital assistant (PDA), or the like.

Computing system 312 may be described in the general context of computer system-executable instructions, such as program modules, being executed by a computer system. Generally, program modules may include routines, programs, objects, components, logic, data structures, and so on that perform particular tasks or implement particular abstract data types.

As depicted in FIG. 3, computing system 312, is shown in the form of a general-purpose computing device. The components of computing system 312 may include, but are not limited to, one or more processors or processing units 316, a system memory 323, and a bus 318 that couples various system components including system memory 323 to processing unit 316.

In one embodiment, processing unit 316 may be based on the z/Architecture® offered by International Business Machines Corporation, or other architectures offered by International Business Machines Corporation or other companies. z/Architecture® is a registered trademark of International Business Machines Corporation, Armonk, N.Y., USA. One embodiment of the z/Architecture® is described in "z/Architecture® Principles of Operation," IBM Publication No. SA22-7832-10, March 2015, which is hereby incorporated herein by reference in its entirety.

In other examples, it may be based on other architectures, such as the Power Architecture offered by International Business Machines Corporation. One embodiment of the Power Architecture is described in "Power ISA™ Version 2.07B," International Business Machines Corporation, Apr. 9, 2015, which is hereby incorporated herein by reference in its entirety. POWER ARCHITECTURE® is a registered trademark of International Business Machines Corporation, Armonk, N.Y., USA. Other names used herein may be registered trademarks, trademarks, or product names of International Business Machines Corporation or other companies.

Bus 318 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computing system 312 can include a variety of computer system readable media. Such media can be any available media that is accessible by computing system 312, and it includes both volatile and non-volatile media, removable and non-removable media.

System memory 323 can include computer system readable media in the form of volatile memory, such as random access memory (RAM) 330 and/or cache memory 332. Computing system 312 may further include other removable/non-removable, volatile/non-volatile computer system storage media. By way of example only, storage system 334 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media could be provided. In such instances, each can be connected to bus 318 by one or more data media interfaces. As described below, memory 323 may include at least one program product having a set (e.g., at least one) of program modules that are configured to carry out various functions of embodiments of the invention.

Program/utility 340, having a set (at least one) of program modules 342, may be stored in memory 323 by way of example, and not limitation, as well as an operating system, one or more application programs, other program modules, and program data. Each of the operating system, one or more application programs, other program modules, and program data or some combination thereof, may include an implementation of a networking environment. Program modules 342 generally carry out various functions and/or methodologies of embodiments of the invention as described herein.

Alternatively, or additionally, connection failure identification and fabrication adjustment processing module, logic, etc., 301 can be provided within computing environment 312.

Computing system 312 can also communicate with one or more external devices 314 such as an imaging subsystem 315, a keyboard, a pointing device, a display 324, etc.; one or more devices that enable a user to interact with computing system 312; and/or any devices (e.g., network card, modem, etc.) that enable computing system 312 to communicate with one or more other computing devices. Such communication can occur via Input/Output (I/O) interfaces 322. Still yet, computing system 312 can communicate with one or more networks such as a local area network (LAN), a general wide area network (WAN), and/or a public network (e.g., the Internet) via network adapter 320. As depicted, network adapter 320 communicates with the other components of computing system, 312, via bus 318. It should be understood that although not shown, other hardware and/or software components could be used in conjunction with computing system 312. Examples, include, but are not limited to: microcode, device drivers, redundant processing units, external disk drive arrays, RAID systems, tape drives, and data archival storage systems, etc.

In one example, the components may include a control engine used in controlling the process aspects disclosed herein, for instance, within a test system, and an evaluation engine for determining a cause for a connection failure, and initiating adjustment of one or more manufacturing processes for the circuit board and/or press-fit connector to correct the determined cause(s) of the connection failure. The components executed by a processor can be individual components or combined in one component. Further, other components can be included to perform one or more other tasks. Many variations are possible.

One or more aspects may relate to or use cloud computing.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 4:
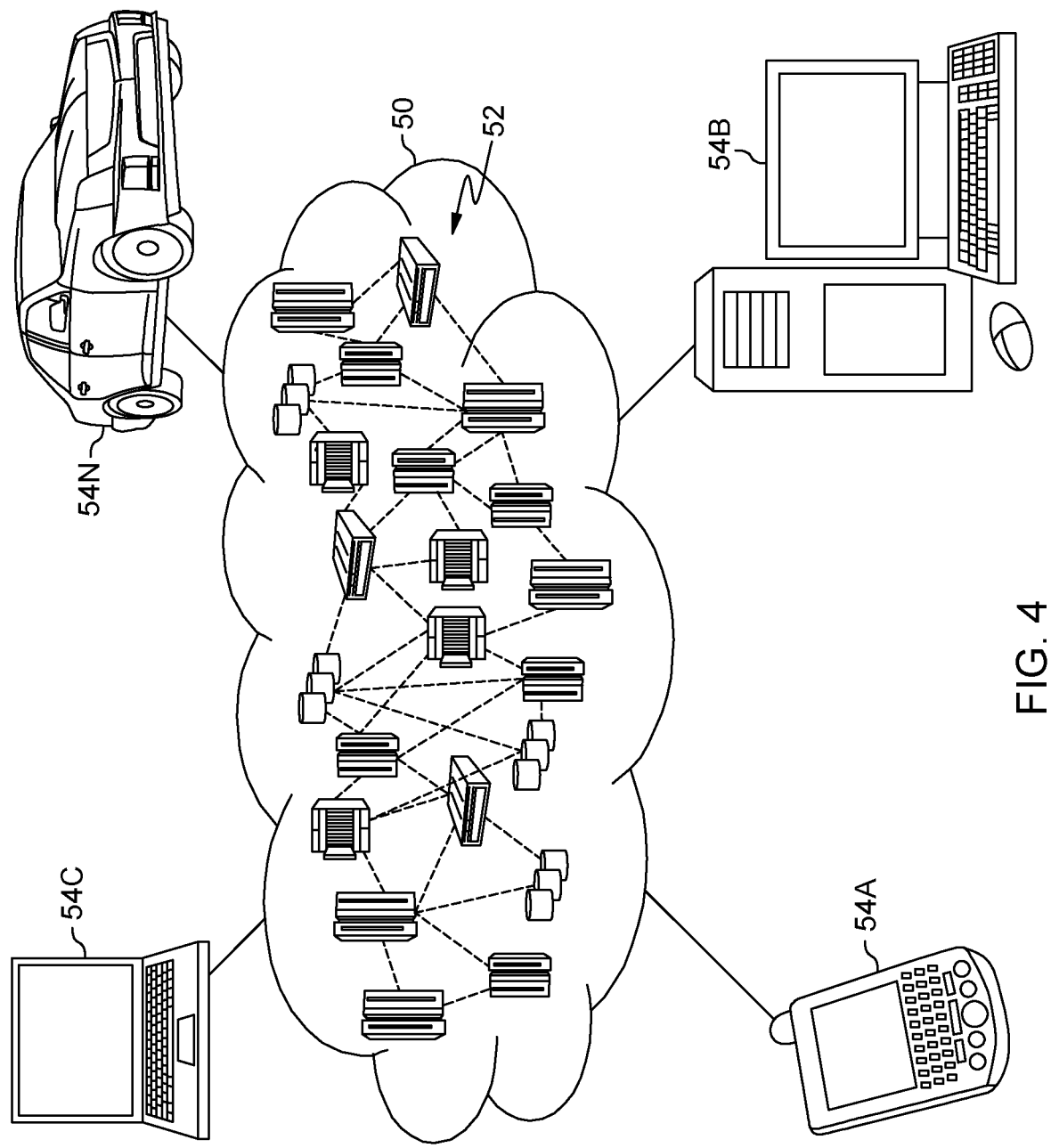
FIG. 4 depicts one embodiment of a cloud computing environment, which may implement, or be used in association with one or more aspects of the present invention.

Referring now to FIG. 4, illustrative cloud computing environment 50 is depicted. As shown, cloud computing environment 50 comprises one or more cloud computing nodes 52 with which local computing devices used by cloud consumers, such as, for example, personal digital assistant (PDA) or cellular telephone 54A, desktop computer 54B, laptop computer 54C, and/or automobile computer system 54N may communicate. Nodes 52 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 5 are intended to be illustrative only and that computing nodes 52 and cloud computing environment 50 can communicate with any type of computerized device over any type of network and/or network addressable connection (e.g., using a web browser).

Figure 5:
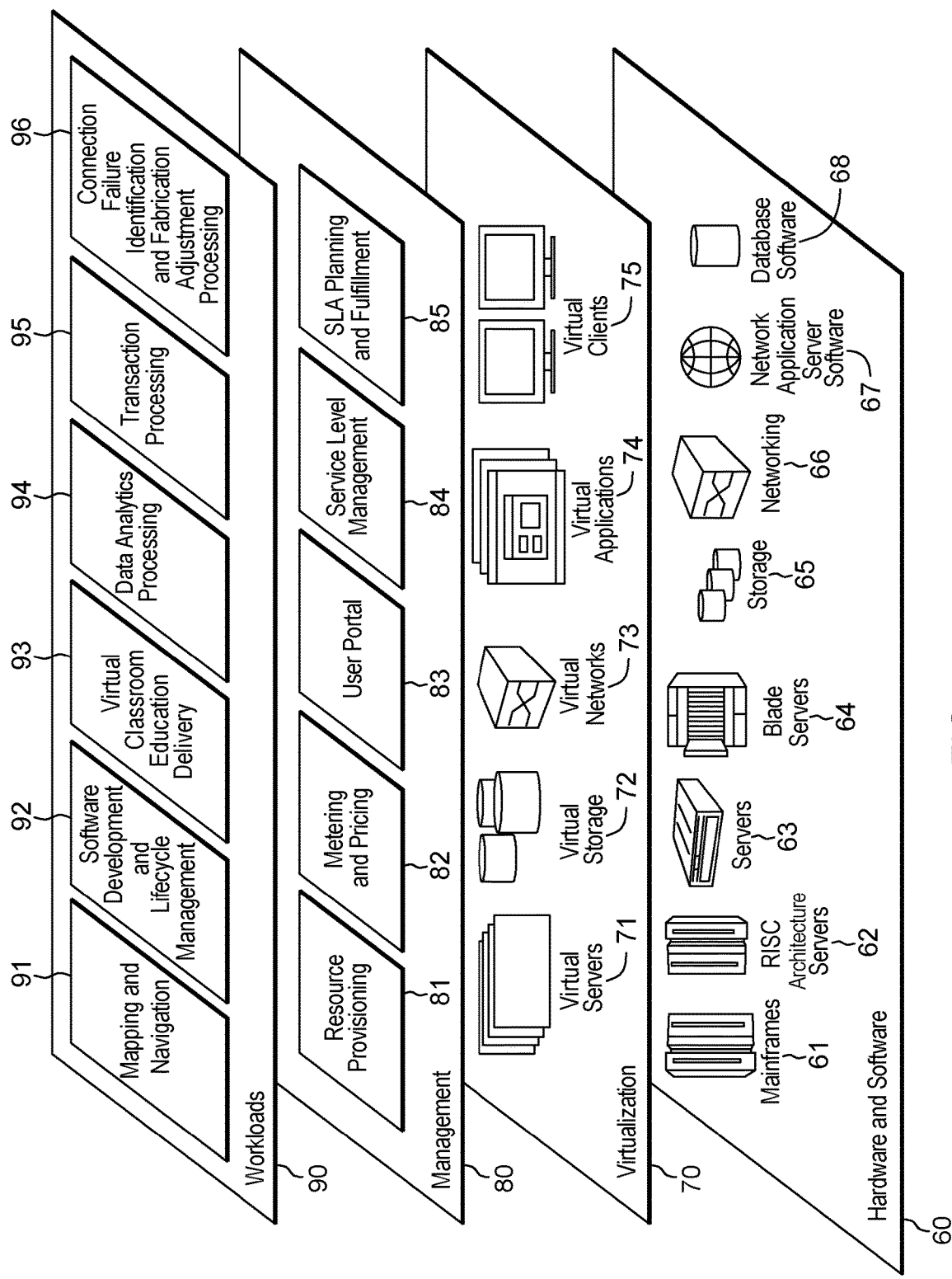
FIG. 5 depicts one example of abstraction model layers, which may facilitate or implement one or more aspects of identifying a connection failure and determining a fabrication adjustment therefor, in accordance with one or more aspects of the present invention.

Referring now to FIG. 5, a set of functional abstraction layers provided by cloud computing environment 50 (FIG. 4) is shown. It should be understood in advance that the components, layers, and functions shown in FIG. 5 are intended to be illustrative only and embodiments of the invention are not limited thereto. As depicted, the following layers and corresponding functions are provided.

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and connection defect identification and fabrication adjustment processing 96.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, other types of devices and/or tracking components may be used in one or more embodiments. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method of facilitating reliable circuit board press-fit connector assembly fabrication, the method comprising:
    identifying a press-fit-connector-to-circuit board connection of the circuit board assembly for testing, the press-fit connector including one or more press-fit pins, and the circuit board including multiple plated through-holes, the one or more press-fit pins being press-fit into one or more corresponding plated through-holes of the multiple plated through-holes at a first surface of the circuit board;
    applying, at a second surface of the circuit board, an electrically insulative liquid to the one or more corresponding plated through-holes with the one or more press-fit pins, the first surface and the second surface of the circuit board being opposite surfaces of the circuit board;
    testing connection of the one or more press-fit pins to the one or more corresponding plated through-holes to identify a connection failure, the electrically insulative liquid facilitating identifying the connection failure, where the identified connection failure can be corrected through an adjustment to the circuit board assembly fabrication.

2. The method of claim 1, further comprising waiting an interval of time after application to allow the electrically insulative liquid to penetrate the one or more corresponding plated through-holes via, at least in part, capillary action.

3. The method of claim 2, further comprising orienting the circuit board assembly for gravity to assist in penetration of the electrically insulative liquid into the one or more corresponding plated through-holes with the one or more press-fit pins.

4. The method of claim 1, wherein the testing comprises testing a press-fit seal between a press-fit pin of the one or more press-fit pins and a corresponding plated through-hole of the one or more corresponding plated through-holes of the circuit board.

5. The method of claim 4, wherein the testing includes applying an electrical signal to the press-fit pin to electrically evaluate the connection in the presence of the electrically insulative liquid applied at the second surface of the circuit board.

6. The method of claim 4, wherein the testing includes retention testing the press-fit pin within the corresponding plated through-hole to mechanically evaluate the connection in the presence of the electrically insulative liquid applied at the second surface of the circuit board.

7. The method of claim 1, wherein the testing comprises continually monitoring electrical connection of the one or more press-fit pins to the one or more corresponding plated through-holes during reliability stressing of the circuit board assembly, the reliability stressing including a test selected from the group consisting of a retention test, a mechanical shock test, a mechanical vibration test, a G-force test, a vacuum test, and a temperature test.

8. The method of claim 1, wherein the applying comprises applying the electrically insulative liquid to, at least in part, the second surface of the circuit board, including over the one or more corresponding plated through-holes.

9. The method of claim 8, wherein the applying utilizes an application technique selected from the group consisting of an aerosol application of the electrically insulative liquid, a spray application of the electrically insulative liquid, a brush application of the electrically insulative liquid, a droplet application of the electrically insulative liquid, and a sponge application of the electrically insulative liquid.

10. The method of claim 1, wherein the electrically insulative liquid comprises a liquid selected from the group consisting of silicone oil and an electrically insulative fluorocarbon-based fluid.

11. The method of claim 1, further comprising determining the fabrication change to the circuit board assembly to correct the connection failure.

12. A system for facilitating reliable circuit board assembly fabrication, the system comprising:
 a test controller configured to perform a method of facilitating circuit board assembly fabrication, the test controller:
  identifying a press-fit-connector-to-circuit board connection of the circuit board assembly for testing, the press-fit connector including one or more press-fit pins, and the circuit board including multiple plated through-holes, the one or more press-fit pins being press-fit into one or more corresponding plated through-holes of the multiple plated through-holes at a first surface of the circuit board;
  applying, at a second surface of the circuit board, an electrically insulative liquid to the one or more corresponding plated through-holes with the one or more press-fit pins, the first surface and the second surface of the circuit board being opposite surfaces of the circuit board;
  testing connection of the one or more press-fit pins to the one or more corresponding plated through-holes to identify a connection failure, the electrically insulative liquid facilitating identifying the connection failure, where the identified connection failure can be corrected through an adjustment to the circuit board assembly fabrication.

13. The system of claim 12, wherein the test controller waits an interval of time after application to allow the electrically insulative liquid to penetrate the one or more corresponding through-holes via, at least in part, capillary action, and orients the circuit board assembly for gravity to assist in penetration of the electrically insulative liquid into the one or more corresponding plated through-holes with the one or more press-fit pins.

14. The system of claim 12, wherein the testing comprises testing a press-fit seal between a press-fit pin of the one or more press-fit pins and a corresponding plated through-hole of the one or more corresponding plated through-holes of the circuit board.

15. The system of claim 14, wherein the testing includes applying an electrical signal to the press-fit pin to electrically evaluate the connection in the presence of the electrically insulative liquid applied at the second surface of the circuit board.

16. The system of claim 14, wherein the testing includes retention testing the press-fit pin within the corresponding plated through-hole to mechanically evaluate the connection in the presence of the electrically insulative liquid applied at the second surface of the circuit board.

17. The system of claim 12, wherein the testing comprises continually monitoring electrical connection of the one or more press-fit pins to the one or more corresponding plated through-holes during reliability stressing of the circuit board assembly, the reliability stressing including a test selected from the group consisting of a retention test, a mechanical shock test, a mechanical vibration test, a G-force test, a vacuum test, and a temperature test.

18. The system of claim 12, wherein the applying comprises applying the electrically insulative liquid to, at least in part, the second surface of the circuit board, including over the one or more corresponding plated through-holes, and wherein the applying utilizes an application technique selected from the group consisting of an aerosol application of the electrically insulative liquid, a spray application of the electrically insulative liquid, a brush application of the electrically insulative liquid, a droplet application of the electrically insulative liquid, and a sponge application of the electrically insulative liquid.

19. The system of claim 12, wherein the electrically insulative liquid comprises a liquid selected from the group consisting of silicone oil and an electrically insulative fluorocarbon-based fluid.

20. A computer program product for facilitating reliable circuit board assembly fabrication, the computer program product comprising:
 a computer-readable storage medium having program instructions embodied therewith, the program instructions being executable by a processor to cause the processor to:
  identify a press-fit-connector-to-circuit board connection of the circuit board assembly for testing, the press-fit connector including one or more press-fit pins, and the circuit board including multiple plated through-holes, the one or more press-fit pins being press-fit into one or more corresponding plated through-holes of the multiple plated through-holes at a first surface of the circuit board;
  apply, at a second surface of the circuit board, an electrically insulative liquid to the one or more corresponding plated through-holes with the one or more press-fit pins, the first surface and the second surface of the circuit board being opposite surfaces of the circuit board; and
  test connection of the one or more press-fit pins to the one or more corresponding plated through-holes to identify a connection failure, the electrically insulative liquid facilitating identifying the connection failure, where the identified connection failure can be corrected through an adjustment to the circuit board assembly fabrication.

* * * * *